United States Patent
Wasserbauer

(10) Patent No.: US 7,126,750 B2
(45) Date of Patent: Oct. 24, 2006

(54) FOLDED CAVITY SEMICONDUCTOR OPTICAL AMPLIFIER (FCSOA)

(76) Inventor: John Gilmary Wasserbauer, 1386 Flannagan Ct., Erie, CO (US) 80516

(\*) Notice: Subject to any disclaimer, the term of this patent is extended or adjusted under 35 U.S.C. 154(b) by 309 days.

(21) Appl. No.: 10/615,426

(22) Filed: Jul. 7, 2003

(65) Prior Publication Data
US 2004/0032647 A1 Feb. 19, 2004

Related U.S. Application Data

(60) Provisional application No. 60/394,368, filed on Jul. 8, 2002.

(51) Int. Cl.
*H01S 3/00* (2006.01)
(52) U.S. Cl. ................................ 359/344
(58) Field of Classification Search ............ 372/45.01; 359/344
See application file for complete search history.

(56) References Cited

U.S. PATENT DOCUMENTS

| | | | | |
|---|---|---|---|---|
| 5,568,499 | A * | 10/1996 | Lear | 372/45.01 |
| 5,914,976 | A * | 6/1999 | Jayaraman et al. | 372/50.21 |
| 6,277,696 | B1 * | 8/2001 | Carey et al. | 438/289 |
| 6,356,571 | B1 * | 3/2002 | Kiely et al. | 372/43.01 |
| 6,362,069 | B1 * | 3/2002 | Forrest et al. | 438/401 |
| 6,625,182 | B1 * | 9/2003 | Kuksenkov et al. | 372/19 |
| 6,704,336 | B1 * | 3/2004 | Henrichs | 372/45.01 |
| 6,798,568 | B1 * | 9/2004 | Wang et al. | 359/344 |
| 6,822,787 | B1 * | 11/2004 | DiJaili et al. | 359/344 |
| 6,836,357 | B1 * | 12/2004 | Wang et al. | 359/344 |
| 6,891,665 | B1 * | 5/2005 | Frateschi | 359/344 |
| 6,909,536 | B1 * | 6/2005 | Walker et al. | 359/337 |
| 2002/0024989 | A1 * | 2/2002 | Coldren et al. | 372/96 |
| 2002/0075929 | A1 * | 6/2002 | Cunningham | 372/50 |
| 2002/0080836 | A1 * | 6/2002 | Hwang | 372/45 |
| 2004/0062283 | A1 * | 4/2004 | Takeuchi et al. | 372/45 |

\* cited by examiner

*Primary Examiner*—Jack Keith
*Assistant Examiner*—Ari M. Diacou
(74) *Attorney, Agent, or Firm*—Intellectual Property Advisors; Damian G. Wasserbauer

(57) ABSTRACT

A folded cavity semiconductor optical amplifier is provided that includes a first mirror disposed on a substrate of semiconductor material and an active region formed thereon consisting of an optical cavity with a gain medium. The optical cavity being disposed adjacent the first mirror. A second mirror is formed and disposed on the active region on a surface opposite the first mirror. The active region of the amplifier includes input and output portions formed in one or both mirrors. The input and output portions formed from layers of reduced reflectivity relative to the first or second mirror and a longitudinal waveguide integral to the optical cavity connecting the input and output portions to allow for light to be amplified to enter at the input port, travel through the vertical cavity and longitudinal waveguide, and exit as amplified light at the output portion of the waveguide structure.

12 Claims, 10 Drawing Sheets
(7 of 10 Drawing Sheet(s) Filed in Color)

FOLDED CAVITY SEMICONDUCTOR OPTICAL AMPLIFIER (FCSOA)

This application claims the benefit of U.S. Provisional Application No. 60/394,368, filed Jul. 8, 2002.

BACKGROUND OF THE INVENTION

1. Field of the Invention

The present invention relates to optical amplifiers and more particularly to a semiconductor optical amplifier having a folded cavity with surface normal input and output.

2. Description of the Related Art

Fiber optic networks are revolutionizing communications technology. Since the hardware used to convert electrons to photons (E to O) and back again (O to E) represents one of the major costs of building and maintaining such networks, recently there has been a trend toward all-optical networks, which bypass these conversions altogether. The advent of the erbium doped fiber amplifier (EDFA) enabled the design and practical implementation of all-optical networks. One disadvantage is that the cost of EDFAs has not fallen along with the rest of the components and sub-systems used in the network, and remain a significant fraction of the system costs.

Semiconductor optical amplifiers (SOAs) have been proposed as a means of reducing this cost in many system applications. SOAs can be fabricated similar to the fabrication of edge emitting lasers, for example, forming a waveguide by cleaving and/or etching of vertical facets in semiconductor materials to form entry and exit points for the amplifying waveguide. Due to their compact size, reduced power consumption and reduced cost of fabrication, semiconductor optical amplifiers (SOAs) have begun to replace EDFAs in short to intermediate reach, narrow band gain applications. The disadvantages of SOAs include much narrower wavelength bands, reduced amplification, and higher noise figure than EDFAs.

One problem in the conventional SOA fabrication process is in the step of device testing. Testing is required in the manufacture of semiconductor optical amplifiers because of device defects that result from the epitaxial growth process and other fabrication process steps. Conventional SOAs require the forming of vertical facets via cleaving and/or etching in semiconductor materials to form the entry and exit points for the amplifying waveguide. Individual devices must then be placed on a submount prior to testing. This step adds expense, which is greatly multiplied by the number of discarded devices. Thus, there is a significant cost advantage for a device that can be tested at the wafer level.

Further cost reductions can be realized by implementing vertical cavity SOAs (VCSOAs). VCSOAs are cheaper to fabricate than edge emitting SOAs primarily due to the planar nature of the facets, the circular output beams and the wafer-level testability. They are also cheaper to assemble due to the relative ease of alignment and the simplicity of the external optics required. Conventional VCSOAs, however, have operational disadvantages inherent from short cavity lengths and a high reflectivity output mirror thereby producing low operation performance, including limited optical amplification, narrow amplification bandwidth and increased output noise. A significant performance advantage can be had if the length of the amplifying cavity can be extended while reducing the optical reflectivity at the entry and exit points. In short, there is a need for a SOA that provides the performance of a conventional edge-emitting SOA with the fabrication, test, assembly and cost advantages of a VCSOA. The present invention provides for all of these needs by extending the amplifying cavity, having vertical input and output, and lowering the reflectivities of the input and output facets.

SUMMARY OF INVENTION

A folded cavity semiconductor optical amplifier (FCSOA) is provided to create a improved VCSOA. The FCSOA includes a semiconductor optical amplifier comprising: a first mirror disposed on a substrate, an active region consisting of an optical cavity having gain medium. The optical cavity is disposed adjacent the first mirror. A second mirror is disposed on the active region on a surface opposite the first mirror. Input and output portions are formed in the mirrors, whereby the input and output portions have formed layers of reduced reflectivity relative to a corresponding first or second mirror. A longitudinal waveguide integral to said optical cavity connects the input and output ports.

In the most generic form of this invention a bottom mirror is disposed on a substrate, an active material is disposed adjacent to the bottom mirror and a top mirror is disposed on the active material forming a folded cavity. The beam of light to be amplified enters and exits the device at the top and/or bottom surfaces. The mirror reflectivities at input and output are significantly reduced. The light to be amplified enters the device at normal or near-normal incidence such that the light propagation in the folded cavity is unidirectional. The active material is electrically or optically pumped so as to provide gain for the light to be amplified. A lateral waveguide concentrates the light and forces the light to travel in a longitudinal direction.

The FCSOA of the present invention advantageously allows for multiple passes through the gain medium while maintaining a single pass through the cavity, such configuration increasing the available amplification for the signal. Additionally, the manufacture of the FCSOA overcomes the disadvantages of conventional SOA's and VCSOA's. For example, the FCSOA of the present invention provides for the near-normal entry and exit for the coupled light, thereby allowing for on-wafer testability, circular beam apertures and integrateability. Furthermore, the FCSOA of the present invention allows for lower reflectivity input and output via application of anti-reflective (AR) coatings and angled entry and exit facets, thereby allowing for additional manufacturing advantages of low feedback, coupling losses and noise figure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, like numerals describe like components throughout the several views.

DESCRIPTION OF THE EMBODIMENTS

In the following detailed description, reference is made to the accompanying drawings, which form a part hereof, and in which is shown by way of illustration specific embodiments in which the invention can be practiced. These embodiments are described in sufficient detail to enable those skilled in the art to practice the invention, and it is to be understood that other embodiments can be utilized and that structural changes can be made without departing from the spirit and scope of the present invention. Throughout this specification dimensions will be referenced as lateral (x-direction), vertical (y-direction), and longitudinal (z-direction). In all embodiments of this invention, a traveling wave propagates in the longitudinal direction and makes a single pass through the structure. Therefore, the following detailed description is not to be taken in a limiting sense, and the scope of the present invention is defined by the appended claims.

Figure 1:
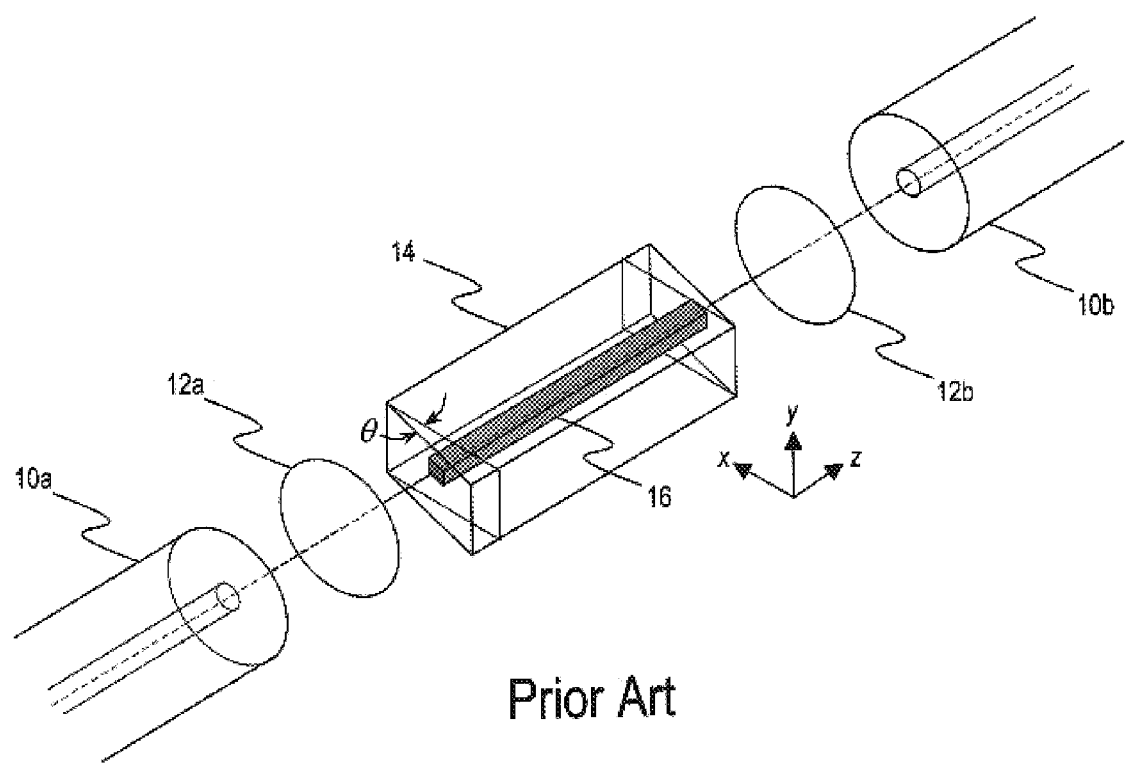
FIG. 1 illustrates a conventional edge emitting SOA with input and output fibers aligned via focusing optical elements.

FIG. 1 illustrates an optical fiber 10 and focusing optics 12 each disposed on opposite sides of a semiconductor optical amplifier (SOA) 14 that includes a waveguide 16 with angled facets, where the facet angle θ is typically 70 from normal. The optical fibers 10a and 10b align with focusing optics 12a and 12b, respectively, on opposite sides of the SOA 14. The SOA structure can be considered an edge-emitting laser 14 with extremely low reflectivity mirrors. Such a SOA structure has two fiber-coupled output facets and differs from a conventional laser, which has one fiber-coupled output facet. The focusing optics 12 and aligned fibers 10 add significant cost to the manufacture of the optical sub-assembly. Another disadvantage in the SOA design relates to the in-plane waveguide having a lack of potential for integration with other active or passive devices due to the cleaved nature of the facets. As a result, the invention seeks to overcome the disadvantages of SOAs such as have begun to replace EDFAs in short to intermediate reach, narrow band gain applications.

Figure 2:
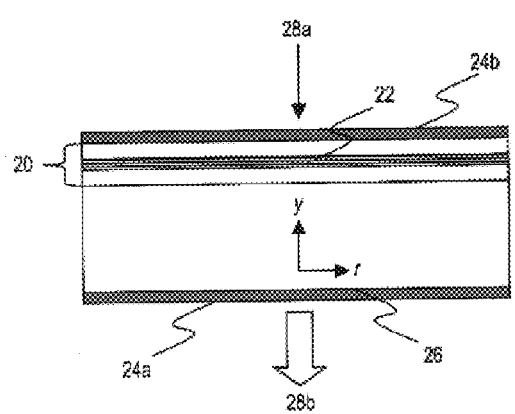
FIG. 2 is a cross-sectional view illustrating a single-pass VCSOA.

Referring to FIG. 2, a simple, single-pass VCSOA is illustrated that comprises an active area 22 surrounded by a cladding region 20, input facet 24a and output facet 24b, all of which are disposed and/or grown on a substrate 26. The VCSOA, in contrast to the SOA, accepts incident light beam 28a normal to the surface and amplifies such incident light to an output level 28b, where the output 28b beam is normal to the surface. Anti-reflective (AR) coatings are applied to both input 24a and output 24b facets to keep reflections to a minimum. Some type of waveguiding structure (not shown) and pumping scheme, either electrical or optical (also not shown), is provided to complete the system. Additionally, the waveguide structure can be made circular to match the shape of the fiber core, which in turn reduces the complexity and cost of alignment optics, such as, for example, utilizing a simple ball lens in place of a cylindrical and aspheric lens combination. Furthermore, it is possible to use a butt coupling for both input and output fibers, thus eliminating the need for focusing optics altogether. In addition to low fabrication and packaging costs, VCSOAs provide the ability to enable amplifier arrays for parallel optical links and have been proposed and demonstrated for use as optical switches.

Figure 3:
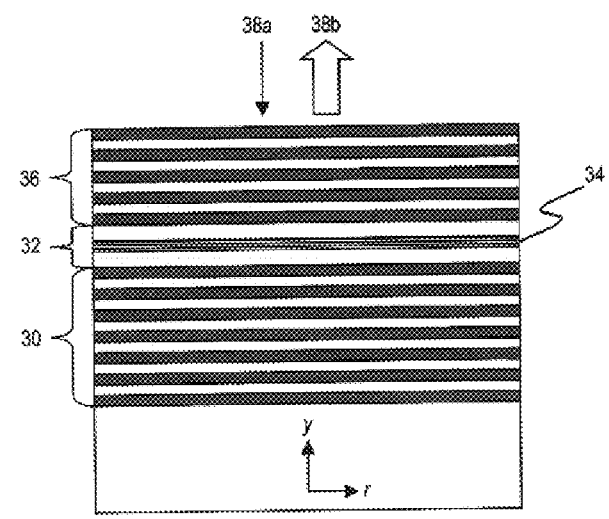
FIG. 3 is a cross-sectional view illustrating a reflection mode, multiple-pass VCSOA.

The disadvantage of the VCSOA to the single-pass structure is illustrated in FIG. 2 and is mainly the limited amount of amplification achievable due to the short length of the active area. Periodic gain structures can be used to increase the cavity length and/or bandwidth of the device. However, only a limited number of periods can be used before uniform optical or electrical pumping becomes difficult or otherwise unproductive. As shown in FIG. 3, a multiple-pass design can overcome these disadvantages. In such a design, also known as a reflective mode VCSOA, a single or multiple-x cavity 30 contains a highly reflective distributed Bragg reflector (DBR) 32 disposed on a substrate, an active area 34 disposed on the highly reflective DBR 32, and a top mirror 36 disposed on the cavity 30 to create a standing wave in the structure. Additionally, some type of waveguiding structure (not shown) and pumping scheme, either electrical or optical (also not shown), must be provided to form the overall waveguide system. In such a design, the input 38a and output 38b beams are at normal or near-normal incidence to the surface. The input beam 38a passes through the first DBR, is reflected multiple times between the bottom and top DBRs, and amplified on each pass through the active area, thus providing greater amplification than a single pass device. However, the design does not provide the amount of amplification of an in-plane device. In addition, the high reflectivity of the output mirror reduces the amplification bandwidth and leads to increased output noise. Furthermore, the highly reflective top mirror will cause lasing at moderate carrier densities, which imposes a limit on the noise FIG. and optical amplification attainable.

Figure 4:
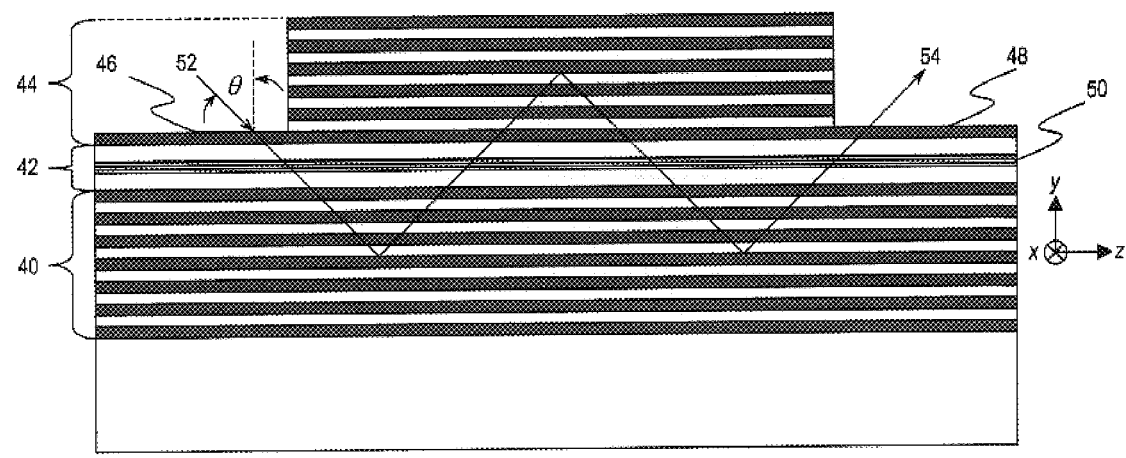
FIG. 4 is a perspective cross-section view illustrating a folded cavity SOA (FCSOA) with dielectric AR coatings for input and output facets.

An exemplary embodiment of the invention is illustrated in FIG. 4. In all embodiments of this invention, a traveling wave propagates in the longitudinal direction and makes a single pass through the structure according to the indicated lateral (x-direction), vertical (y-direction), and longitudinal (z-direction). The VCSOA comprises a bottom mirror 40 disposed on a substrate, a 1-λ cavity 42, and a top mirror 44 disposed adjacent to the cavity 42. The light beams enter and exit at the input 46 and output 48 areas. The 1-λ cavity 42 contains an active region 50 disposed adjacent to the bottom mirror to reflect the input light 52 to be amplified. The active region 50 can be composed of quantum dots, quantum wires, quantum wells, or a bulk active material that provides gain in the desired wavelength band. In operation, the light to be amplified 52 enters at the input 46, propagates longitudinally in a zig-zag fashion through the active region. The amplified light 54 exits at the output 48. The bottom and top mirrors 40 and 44, respectively, can be made of semiconductor material. According to this embodiment of the present invention, the bottom mirror 40, active region 50, and top mirror 44 are composed of semiconductor material and can be epitaxially grown. Exemplary semiconductor materials include InP/InGaAsP, GaAs/AlGaAs or other III-V or II-VI compounds. Both mirrors are designed to give sufficient reflectivity at the angle of propagation θ. Both input and output beams enter and exit the device on the upper portion or top side of the device. The entry 46 and exit 48 points contain AR layers to provide maximum coupling into and out of the structure.

As is illustrated in FIG. 4, and in other embodiments of the present invention, the design has particular advantages to allow for an unlimited number of vertical passes through the active area while retaining a single longitudinal pass, thus providing for the maximum gain subject to the saturation limitations of the gain medium. The number of passes per unit length of waveguide depends on the input angle. In other words, θ can be varied to vary the amount of optical overlap between passes, thereby allowing for the amount of gain saturation to be reduced.

Figure 5:
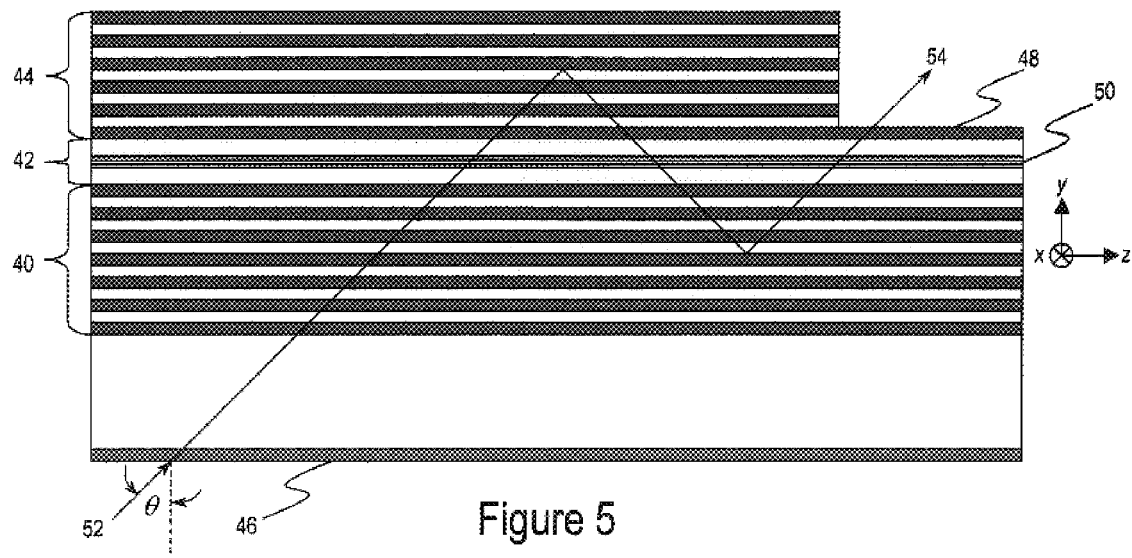
FIG. 5 is a perspective cross-section view illustrating a folded cavity SOA with dielectric AR coatings for input and output facets.

In an alternative embodiment the light can enter or exit the device from opposite sides of the structure. Referring to FIG. 5, a bottom mirror 40 is disposed on a substrate where the bottom mirror 40 and active areas of the cavity 42, top mirror 44 and active region are epitaxially grown. The light to be amplified 52 enters the device from the bottom at input 46 and exits the device at the top at the output 48. A 1-λ cavity 42 containing an active region 50 is disposed adjacent to the bottom mirror 40. A top mirror 44 is disposed adjacent to the cavity 42. According to this embodiment, the bottom mirror 40 and top mirror 44 can be made from semiconductor material. In operation, the light to be amplified 52 enters at the input 46 and propagates longitudinally in a zig-zag fashion through the active region. The amplified light 54 exits at the output 48. The entry at input 46 and exit at output 48 are antireflection coated to provide maximum coupling into and out of the structure.

Figure 6:
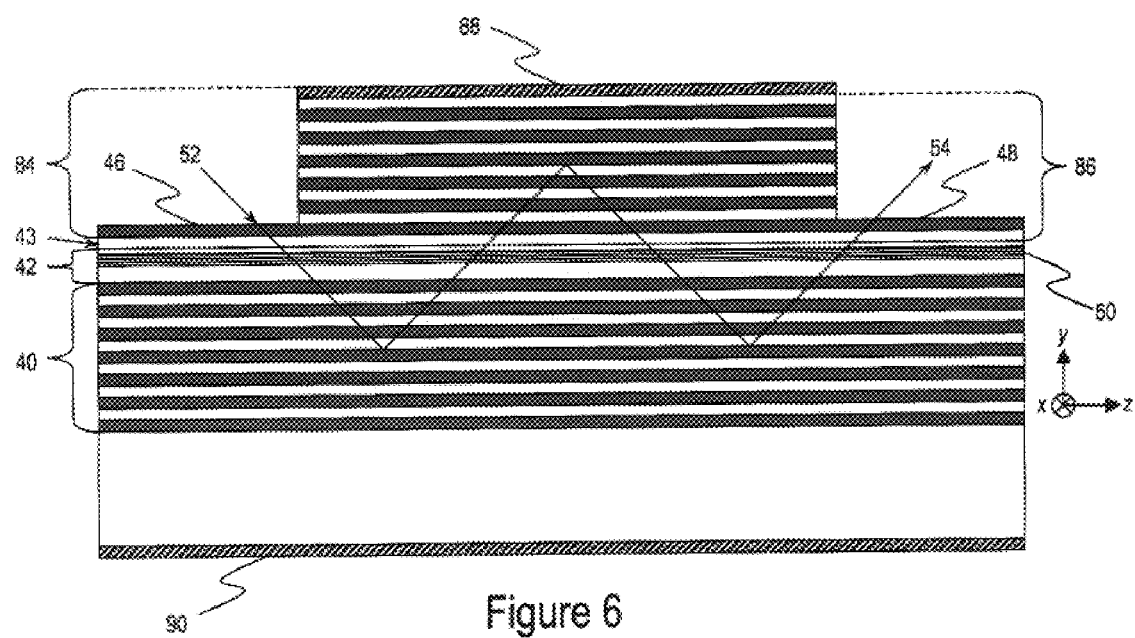
FIG. 6 is a perspective cross-section view illustrating a folded cavity SOA with AR coatings for input and output facets.

Referring to FIG. 6, an alternative embodiment of the present invention is illustrated whereby a semiconductor bottom mirror 40 is disposed on a substrate and the bottom mirror 40 and active areas are epitaxially grown. In this embodiment, however, the top mirror 42 is composed of metamorphic 43 material(non-lattice matched). Exemplary metamorphic materials include GaAs/AlGaAs grown on a non-lattice matched substrate, such as InP, or other suitable materials. Alternatively, lattice-matched semiconductor materials can be used to form the cavity and top mirror structure whereby the single crystal nature of the entire structure is maintained. The light to be amplified 52 enters at input 46 and exits at output 48 as amplified light 54, whereby the light beams both enter and exit the device on the top side. According to the embodiment, a ¾-λ cavity 42 containing an active region 50 is disposed adjacent to the bottom mirror 40. Similarly, a ¼λ metamorphic layer 43 with high refractive index is disposed adjacent the partial cavity 42 forming a 1-λ hybrid cavity. The metamorphic layer 43 has its interface disposed or placed at a null in the optical field so as to minimize scattering and absorption losses due to defects. Furthermore, additional layers of thickness equal to an integer multiple of ½λ can be inserted above or below the metamorphic interface without changing the location of the null. A top metamorphic DBR mirror 84 is disposed adjacent to the hybrid cavity 42, which includes the metamorphic layer 43. In the described exemplary embodiment, the bottom mirror 40 is made of InP/InGaAsP while the top mirror 84 is made of a GaAs/AlGaAs. A top metal contact 88 is used to increase the reflectivity of the top mirror, or to pump current through the mirror, or both. The light to be amplified 52 enters at the input 46, propagates longitudinally in a zig-zag fashion through the active region, and the amplified light 54 exits at the output 48. The entry 46 and exit 48 points contain AR layers to provide maximum coupling into and out of the structure. In a variation on this embodiment, a dielectric material can be substituted for the metamorphic material layer for layer. However, in this case electrodes would necessarily be placed on the side of the waveguide. Exemplary dielectric materials include, $SiN_x$, $SiO_2$, ZnSe, $MgF_2$, or other suitable dielectric materials.

In order to avoid losses in the lateral (x) direction a waveguide must be formed in the plane of the device parallel to the substrate and, for many communications applications, it is important that the waveguide support only one mode. This waveguide can be tapered to expand or contract the beam so as to allow for greater optical power or greater power density, respectively. There are many approaches for controlling the transverse mode in a waveguide. However, they generally fall into two broad categories: gain/loss modulation and index modulation. In the first category, the imaginary part of the refractive index is tailored laterally so as to provide more gain or less loss for the fundamental mode with respect to higher order modes. An example of gain modulation is the use of a current constriction element, such as an oxide or implant aperture, to preferentially pump the fundamental mode. Similarly, there are a variety of methods that can be used to provide loss modulation. For example, anti-phasing of a mirror can be used to increase transmission losses for higher order modes to provide selective loss modulation. Further, the optical cavity can be extended to increase diffraction losses for higher order modes, or selective mirror doping can be used to increase absorption losses for higher order modes.

Index modulation techniques, by contrast, tailor the real part of the refractive index laterally so as to form a waveguide. Methods of index modulation include lateral regrowth of lower index material, ridge waveguide formation, oxide apertures, and effective index guiding via resonant cavity wavelength modulation. To form a waveguide using any of the index modulation methods requires creating a region of higher index surrounded by a region of lower index. The relative index step determines the width and height of the waveguide for single mode operation. The greater the index step between the effective indexes of refraction, the smaller the single mode cutoff dimensions. The lateral regrowth method is used to produce buried heterostructure waveguides much like the waveguide 16 shown in FIG. 1.

Figure 7:
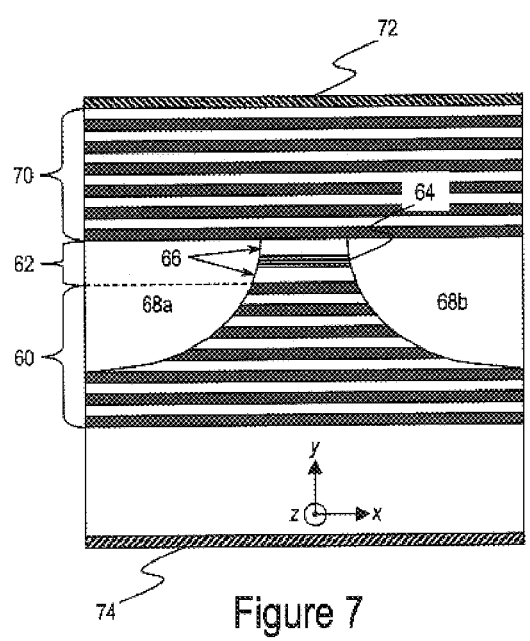
FIG. 7 is an end view cross section illustrating a folded cavity SOA with an epitaxially regrown waveguide.

Referring to FIG. 7, a folded cavity SOA can utilize the lateral regrowth method to create a waveguide structure. In this embodiment the bottom mirror 60 and active region 64 are epitaxially grown, a first regrowth is used to define the waveguide, and a second regrowth is used to deposit the top mirror 70. The longitudinal waveguide is generated by a lateral index step created by the regrown cladding layers. In this structure a bottom mirror 60 is disposed on a substrate. A 1-λ cavity 62 comprised of an active region 64 surrounded by two cladding layers 66 of lower index of refraction is disposed adjacent to the bottom mirror. A mesa is then patterned into this structure using planar fabrication techniques. An epitaxial growth technique, such as metal-organic chemical vapor deposition (MOCVD), is used to selectively replace the etched material with additional cladding material 68, thereby completely surrounding the active area with lower index of refraction material. A second, non-selective regrowth can be used to add a top mirror 70 and/or contact layer to the waveguide structure. Electrodes 72 and 74 are disposed on the top and bottom of the waveguide structure, respectively. Current constriction can be achieved by selecting an appropriate material, such as semi-insulating InP, for the first regrowth.

Figure 8:
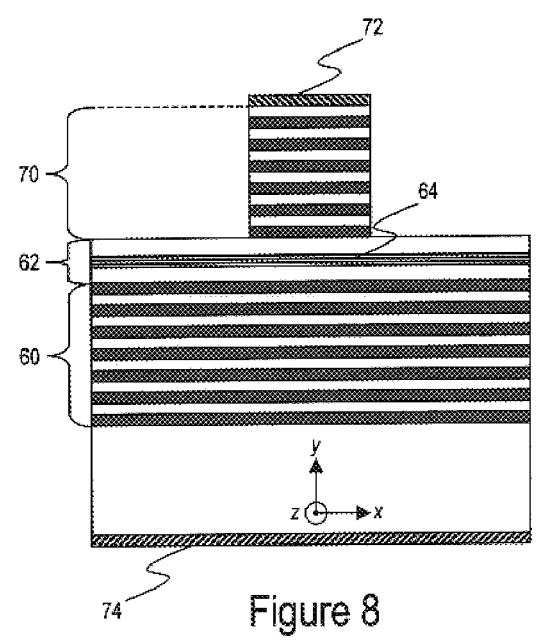
FIG. 8 is an end view cross section illustrating a folded cavity SOA with a ridge waveguide.

As applied to a FCSOA, the ridge waveguide technique can be used to create a structure such as that illustrated in FIG. 8. In this embodiment the bottom mirror 60, active region or area 62, and top mirror 70 are epitaxially grown. The longitudinal waveguide is generated by a lateral effective index step created by the mesa etched into the top mirror 70. In this embodiment, a bottom mirror 60 is disposed on a substrate, a 1-λ cavity 62 comprised of an active region 64 surrounded by cladding layers of lower index of refraction is disposed adjacent to the bottom mirror 60, and a top mirror 70 is disposed on the cavity 62. A top electrode 72 is disposed on the top mirror 70 and patterned in the shape of a waveguide. A bottom electrode 74 is disposed on the bottom surface of the substrate. The top electrode 72 can be used to increase the reflectivity of the top mirror 60 as well as for current injection. Using the metal as a mask, the top mirror 60 layers are etched down to the 1-λ cavity 62, using a standard etch technique as is known in the art. The optical field penetrates the cladding layer to the etched surface where a lower index of refraction material is present, typically either air or dielectric. This arrangement produces a slightly lower index of refraction just outside the ridge compared to underneath the ridge, thus forming a waveguide. If the ridge is conducting, for example, in the case of a lattice matched or metamorphic mirror, then current constriction is achieved via the mesa etch. If the ridge is non-conducting, for example, in the case of a dielectric top mirror, then current constriction can be achieved by ion implantation.

Figure 9:
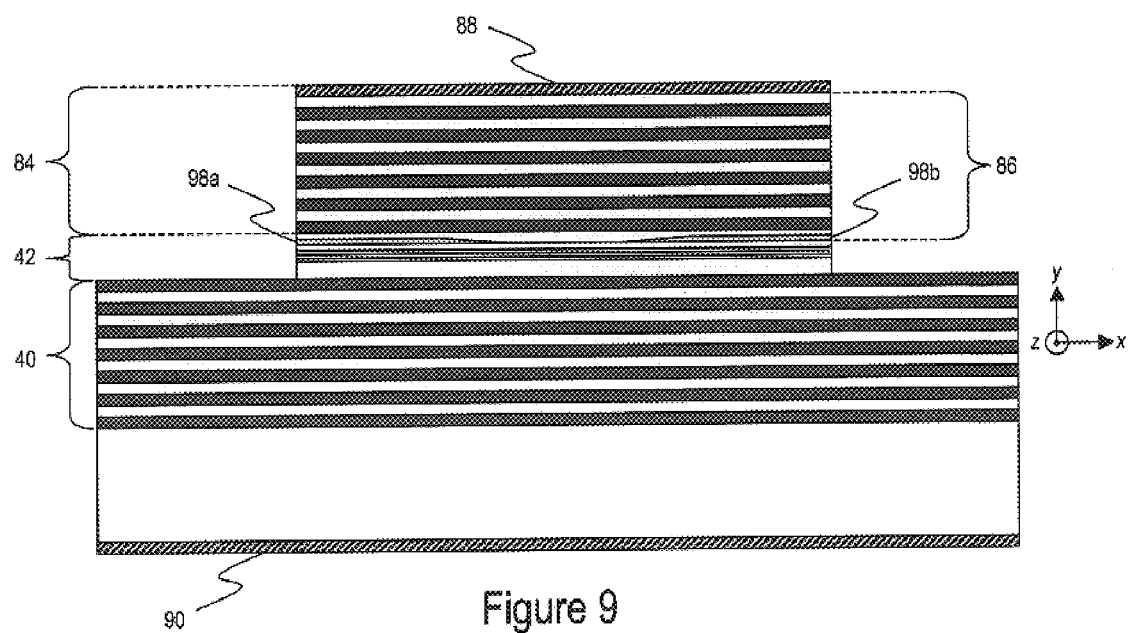
FIG. 9 is an end view cross section illustrating a folded cavity SOA with AR coatings for input and output facets.

In yet another embodiment of the present invention, the oxide aperture technique can be used to create a waveguide for the exemplary embodiment of FIG. 6. Referring to FIG. 9, a bottom mirror 40 is disposed on a substrate, whereby the bottom mirror and active areas are epitaxially grown. The top mirror is composed of metamorphic material. The longitudinal waveguide is generated by a lateral effective index step generated by partial oxidation of the metamorphic mirror. Both input and output beams enter and exit the device on the upper portion or side of the waveguide. A ¾-k cavity 42 containing an active region 50 is disposed adjacent to the bottom mirror 40. A ¼-metamorphic layer 43 with high refractive index is disposed adjacent the partial cavity 42 forming a 1-λ hybrid cavity. A top metamorphic DBR mirror 84 is disposed adjacent to the hybrid cavity 42 and dielectric or metamorphic layer 43. In order to form the waveguide of the invention, a mesa is etched through all of the metamorphic layers 86, and a layer containing a high concentration of aluminum 98 is exposed. The structure is placed into an oxidizing environment, whereby an oxide grows from the etched surfaces toward the center of the waveguide. Since the oxide has a lower index of refraction than the surrounding semiconductor material, the effective index of refraction is lower for the oxidized outer portions of the mesa 98a, 98b than for the unoxidized inner portion, thereby producing a waveguide. This formation technique is referred to as effective index guiding via resonant cavity wavelength modulation and further applies to resonant cavities such as, for example, those found in a vertical cavity laser (VCL). When the wave equation is separable into horizontal and vertical solutions, it can be shown that, for the vertical mode, $$\frac{\Delta n_{eff}}{n_{eff}} = \frac{\Delta \lambda}{\lambda}. \quad \text{(Eq. 1)}$$

where $n_{eff}$ is the vertical effective index and A is the vertical resonant wavelength. $A_{neff}$ is the effective index step from the core to the cladding and is give as $A_{neff}=n_{cladding}-n_{core}$. Similarly $\Delta\lambda=\lambda_{cladding}-\lambda_{core}$. The sign of the effective index step can be negative, which produces a waveguide, or positive, which produces an antiguide. As a result, by modifying the wavelength of the vertical cavity in the lateral direction, an effective index difference between the core and cladding can be created. The effective index technique can be used to develop high-power, single mode vertical cavity lasers (VCLs) for high speed data communications. The effective index technique outlined herein advantageously can be used to create a waveguide as is illustrated in FIG. 4.

Figure 10:
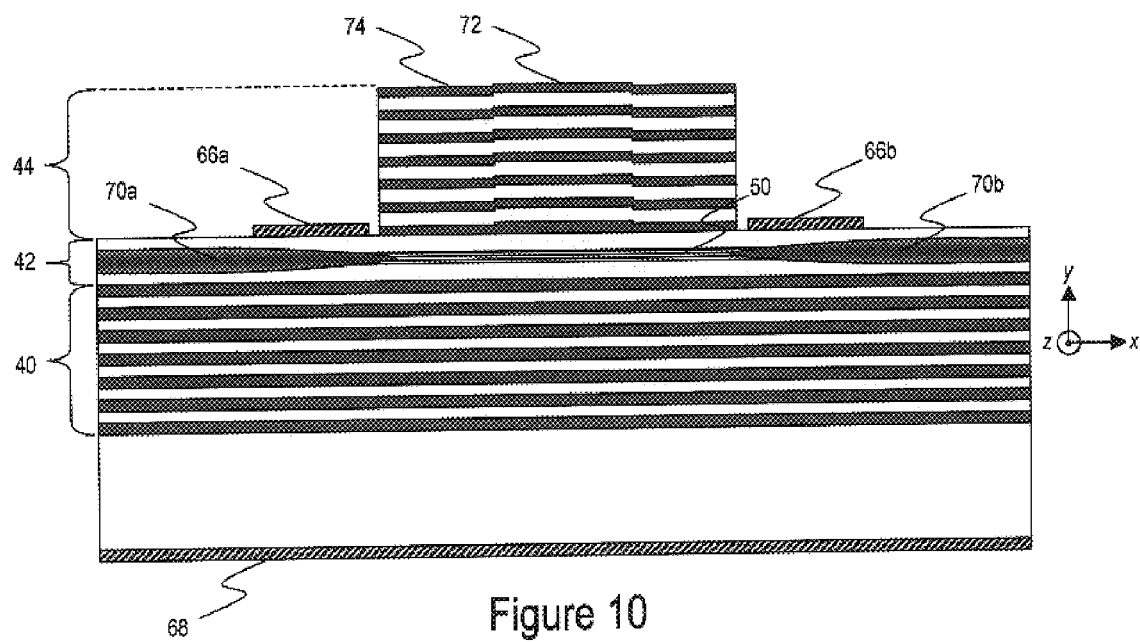
FIG. 10 is an end view cross section illustrating a folded cavity SOA with dielectric AR coatings for input and output facets.

Referring to FIG. 10, yet another embodiment of the present invention can be utilized to form a waveguide. The bottom mirror 40 and active region or areas 42 are epitaxially grown and the top mirror is composed of dielectric material. Here again the bottom mirror 40 is disposed on a substrate. The longitudinal waveguide is generated by a lateral effective index step located in the dielectric mirror. Both input and output beams enter and exit the device on the upper portion or top side. A 1-λ cavity 42 containing an active region 50 is disposed adjacent to the bottom mirror 40. A top mirror 44 is disposed adjacent to the cavity 42. To form the waveguide, the thickness of one of the top mirror layers is varied laterally such that it is thinner in the cladding region 74 than in the core 72. This causes $\lambda_{cladding}<A_{core}$ resulting in $A_{neff}<0$, which forms a waveguide. As is shown from Eq. 1, only 1–2 nm of wavelength difference is sufficient to form the waveguide. This can be achieved by creating a thin step (5–10 nm) near the active area, or a thicker one farther from the active area in the vertical (y) direction. The thickness of the step must be calculated numerically. The electrodes disposed on the top 66 and the bottom 68 of the waveguide provide current injection. Current constriction is provided by an ion implant 70, for example, by using a hydrogen or oxygen species.

Figure 11:
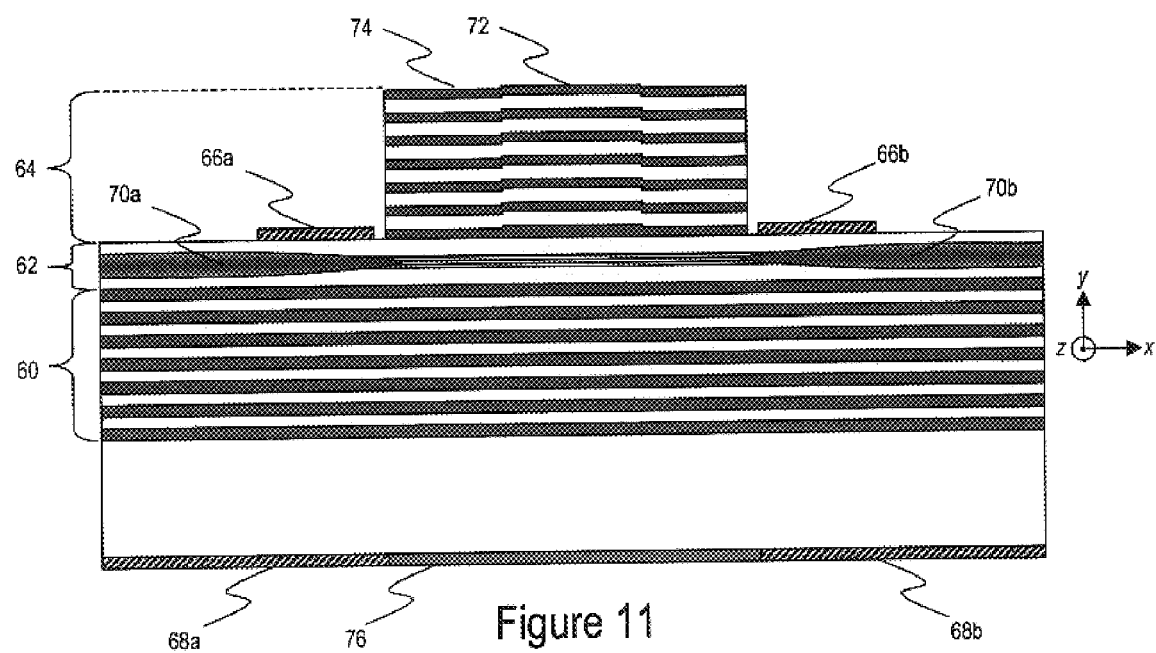
FIG. 11 is an end view cross section a folded cavity SOA with dielectric AR coatings for input and output facets.

Referring to FIG. 11, if the input or output beam is taken through the substrate, then an opening 76 is made in the bottom contact 68 to form portions 68a and 68b. The opening 76 can be AR coated. In this embodiment of the present invention, the bottom mirror 60 and active areas 62 are epitaxially grown and the top mirror is composed of dielectric material. The longitudinal waveguide is generated by a lateral effective index step located in the dielectric mirror. The input beam enters the device from the bottom and the output beam exits the device from the top.

Figure 12:
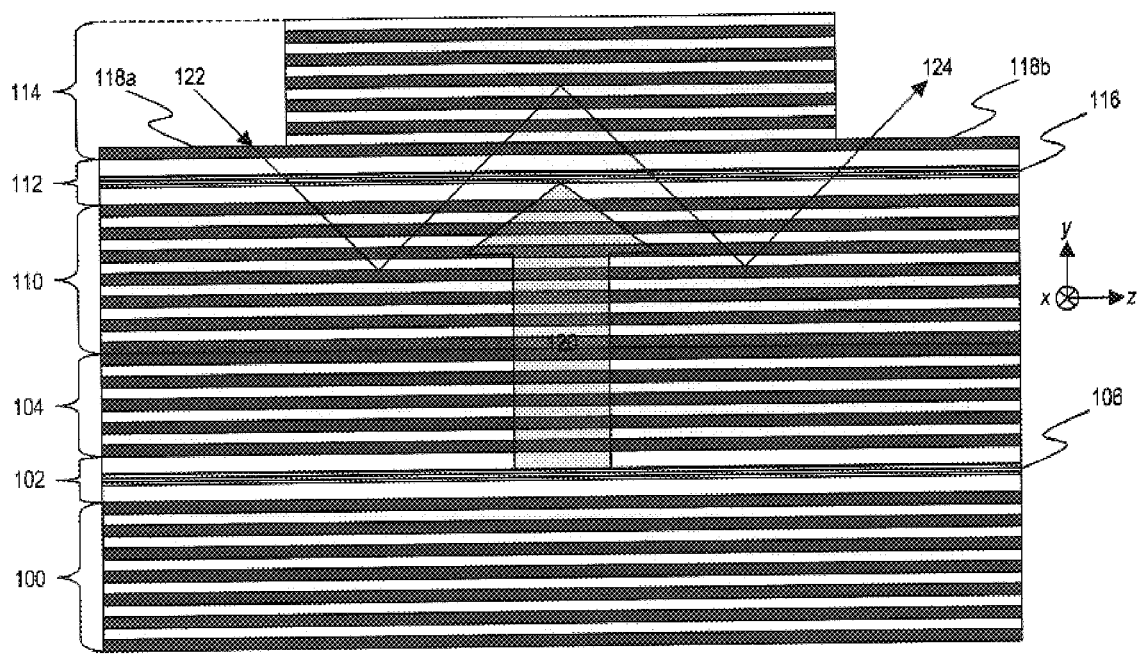
FIG. 12 is a side view cross section a folded cavity SOA monolithic, optically pumped FCSOA with dielectric AR coatings for input and output facets.

In yet another embodiment, optical pumping can be used to provide the gain for the amplifier. A monolithic, metamorphic or wafer-fused structure can be used to provide the gain, as illustrated in FIG. 12. In this embodiment the pump laser is grown epitaxially. The amplifier bottom mirror and active areas are then epitaxially grown and the top mirror is composed of dielectric material. Both input and output beams enter and exit the device on the top side. Considering as an example the case of a monolithic structure, a first mirror 100 is disposed on a substrate (not shown). A 1-λ cavity 102 containing an active area 106 providing gain at a short, pump wavelength is disposed adjacent to the first mirror. A second mirror 104 is disposed adjacent to the cavity 102. These first elements comprise a VCL that provides optical power at the pump wavelength 120. The majority of the pump power is directed upwards at the amplifier structure disposed on the pump VCL. The amplifier structure comprises a third mirror 110 disposed on the second mirror 104, which is significantly transparent at the pump wavelength. A second 1-λ cavity 112 containing an active area 116 providing gain at the amplification wavelength is disposed adjacent to the third mirror. A fourth mirror 114 is disposed adjacent to the second cavity 112. The pump VCL output beam 120 is significantly absorbed in the amplifier gain medium 116 creating electron-hole pairs that provide gain at the amplification wavelength. The light to be amplified 122 enters at the input 118a, propagates longitudinally in a zig-zag fashion through the active region. The amplified light 124 exits at the output 118b. The entry 118a and exit 118b points are AR coated to provide maximum coupling into and out of the structure. In addition to pumping from below, a pump laser can also be coupled in from the side or an end of the amplifier waveguide. Finally, the pump power can be coupled into the structure via the entry 118a and exit 118b points.

The previous description of the disclosed embodiments is provided to enable any person skilled in the art to make or use the present invention. Various modifications to these embodiments will be readily apparent to those skilled in the art, and the generic principles defined herein can be applied to other embodiments without departing from the spirit or scope of the invention. For example, the present invention can be practiced with any of a variety of Group III-V or Group II-VI material systems that are designed to emit at any of a variety of wavelengths. It is therefore desired that the present embodiments be considered in all respects as illustrative and not restrictive, reference being made to the appended claims rather than the foregoing description to indicate the scope of the invention.

The semiconductor optical amplifier of the present invention advantageously can be manufactured using a method that includes the steps of growing an epitaxial DBR mirror with cavity and gain regions. Depositing additional dielectric material on the substrate forms a hybrid cavity. A waveguide pattern is formed using an ion implant mask in the shape of the desired waveguide as set forth herein. Current confinement is achieved by implanting ions into the cavity just above the gain region. The implant mask is used to form a lateral thickness step, which forms a lateral effective index step, by etching a portion of hybrid cavity. The ion implant mask is removed to make way for the forming of electrical contacts within the cavity (p-side) and within or below the cavity (n-side), also referred to as intra-cavity contacts. Next a dielectric DBR mirror is deposited on the hybrid cavity and the waveguide. Finally, vertical holes or vias are etched in the mirror at the terminals of the waveguide forming input and output ports. An additional step of adding anti-reflective coating can be used to enhance the coupling efficiency of the input and output ports.

The present invention would be used in telecommunications and data-communications where low-cost, narrow-band amplification or amplifier integration, such as multiplexing or de-multiplexing of wavelengths, would provide a competitive advantage. Such needs can be found in the metropolitan access network (MAN), or in optical switching or integration applications. If sufficient advances in performance can be realized, the application space would open up to the long-haul network as well. This invention can also represent an enabling technology for the realization of opto-electronic integrated circuits.

It is understood that the above description is intended to be illustrative, and not restrictive. Many other embodiments will be apparent to those of skill in the art upon reviewing the above description. The scope of the invention should, therefore, be determined with reference to the appended claims along with the full scope of equivalents to which such claims are entitled.

What is claimed is:

1. A semiconductor optical amplifier comprising:
   a first mirror disposed on a substrate;
   an active region consisting of an optical cavity having gain medium, said optical cavity being disposed adjacent said first mirror;
   a second mirror disposed on said active region on a surface opposite said first mirror;
   input and output portions formed in said mirrors, said input and output portions having formed layers of reduced reflectivity relative to a corresponding first or second mirror; and
   a longitudinal waveguide integral to said optical cavity connecting input and output ports, whereby said longitudinal waveguide is configured with a downward step in reflectivity at said input and output ports of the optical amplifier.

2. The semiconductor optical amplifier of claim 1, whereas said gain medium is electrically or optically pumped.

3. The semiconductor optical amplifier of claim 1, whereas said input and output ports lie on the same sides of a vertical structure of the optical amplifier.

4. The semiconductor optical amplifier of claim 1, whereas said input and output ports lie on opposite sides of a vertical structure of the optical amplifier.

5. The semiconductor optical amplifier of claim 1, whereas said first and second mirrors consist of distributed Bragg reflectors from the group of a series of high and low index lattice-matched or metamorphic semiconductor layers disposed on either of said substrate or said first mirror by epitaxial growth.

6. The semiconductor optical amplifier of claim 1, whereas said second mirror consists of a distributed Bragg reflector from the group of a series of high and low index dielectric layers disposed on said first mirror by non-epitaxial growth.

7. The semiconductor optical amplifier of claim 1, whereas said longitudinal waveguide is gain/loss modulated in a lateral direction of the optical amplifier.

8. The semiconductor optical amplifier of claim 1, whereas said longitudinal waveguide is index modulated in a lateral direction of the optical amplifier.

9. The semiconductor optical amplifier of claim 1 whereas said first mirror, said optical cavity with gain material, and said second mirror are composed of lattice-matched semiconductor material, whereby and said longitudinal waveguide is formed by an either etch and regrowth or a ridge waveguide technique.

10. The semiconductor optical amplifier of claim 1 whereas said first mirror and said optical cavity with gain material are composed of lattice-matched semiconductor material, said second mirror is composed of different lattice-matched metamorphic semiconductor material; and said longitudinal waveguide is formed by etch and oxidation of said metamorphic material.

11. The semiconductor optical amplifier of claim 1 whereas said first mirror and said optical cavity with gain material are composed of lattice-matched semiconductor material, said second mirror is composed of dielectric material, and said longitudinal waveguide is formed by an effective index waveguide technique.

12. The semiconductor optical amplifier of claim 2 whereas said optical pumping is provided by a monolithically grown vertical cavity laser (VCL) structure that is wafer-fused to the semiconductor optical amplifier (SOA) structure.

* * * * *